United States Patent
Hallam et al.

(10) Patent No.: US 10,505,069 B2
(45) Date of Patent: Dec. 10, 2019

(54) METHOD FOR PROCESSING SILICON MATERIAL

(71) Applicant: NewSouth Innovations Pty Limited, Sydney, New South Wales (AU)

(72) Inventors: Brett Jason Hallam, Bexley (AU); Stuart Ross Wenham, Cronulla (AU); Malcolm David Abbott, Naremburn (AU); Phillip George Hamer, Kensington (AU)

(73) Assignee: NewSouth Innovations Pty Limited, Sydney, New South Wales (AU)

( * ) Notice: Subject to any disclaimer, the term of this patent is extended or adjusted under 35 U.S.C. 154(b) by 178 days.

(21) Appl. No.: 15/557,215

(22) PCT Filed: Mar. 11, 2016

(86) PCT No.: PCT/AU2016/050174
§ 371 (c)(1),
(2) Date: Sep. 11, 2017

(87) PCT Pub. No.: WO2016/145482
PCT Pub. Date: Sep. 22, 2016

(65) Prior Publication Data
US 2018/0040760 A1     Feb. 8, 2018

(30) Foreign Application Priority Data

Mar. 13, 2015 (AU) ............................... 2015900915
Aug. 14, 2015 (AU) ............................... 2015903283

(51) Int. Cl.
*H01L 21/00* (2006.01)
*H01L 31/18* (2006.01)

(52) U.S. Cl.
CPC ...... *H01L 31/1868* (2013.01); *H01L 31/1804* (2013.01)

(58) Field of Classification Search
CPC .................... H01L 31/1868; H01L 31/1804
See application file for complete search history.

(56) References Cited

U.S. PATENT DOCUMENTS 8,263,176 B2    9/2012  Herguth et al.

FOREIGN PATENT DOCUMENTS

| EP | 2963692 A1 | 6/2016 |
|---|---|---|
| WO | 2014/041260 A1 | 3/2014 |
| WO | 2014/206504 A1 | 12/2014 |

OTHER PUBLICATIONS

International Search Report and Written Opinion for Application No. PCT/AU2016/050174 dated May 9, 2016 (9 pages).
Lindroos J. et al., "Preventing light-induced degradation in multicrystalline silicon", Journal of Applied Physics, Apr. 15, 2014, vol. 115, pp. 154902-1 to 154902-5.

(Continued)

*Primary Examiner* — Richard A Booth
(74) *Attorney, Agent, or Firm* — Michael Best & Friedrich LLP

(57) ABSTRACT

The present disclosure provides a method for accelerating the formation of defects in doped silicon. A doped silicon area is exposed with high intensity electromagnetic radiation to provide a substantial excess of majority carriers and promote a high rate of defect formation to allow efficient silicon passivation.

21 Claims, 17 Drawing Sheets

(56) References Cited

OTHER PUBLICATIONS

Schmidt J. et al., "Injection level dependence of the defect-related carrier lifetime in light-degraded boron-doped Czochralski silicon", Applied Physics Letters, Oct. 12, 1998, vol. 73, No. 15, pp. 2167-2169.
Song L. et al., "Laser Enhanced Hydrogen Passivation of Silicon Wafers", Hindawi Publishing Corporation, International Journal of Photoenergy, Mar. 13, 2015, vol. 2015, Article ID 193892, pp. 1-14.
Vainola H. et al., "Sensitive Copper Detection in P-type CZ Silicon using μPCD", Journal of the Electrochemical Society, Oct. 23, 2003, vol. 150, (12), pp. G790-G794.
Brett J. Hallam, et al, "Advanced hydrogenation of dislocation clusters and boron-oxygen defects in silicon solar cells", Energy Procedia 5th International Conference on Silicon Photovoltaics, vol. 77, (Aug. 1, 2015) pp. 799-809.
Brett J. Hallam, et al, "Implications of Accelerated Recombination-Active Defect Complex Formation for Mitigating Carrier-Induced Degradation in Silicon", IEEE Journal of Photovoltaics, vol. 6 No. 1, (Jan. 1, 2016) pp. 92-99.
Phillip Hamer et al., "Accelerated formation of the boron-oxygen complex in p-type Czochralski silicon", Physica Status Solid Rapid Research Letters, vol. 9 No. 5, (Apr. 2, 2015), pp. 297-300.
Svenja Wilking, et al., "High Speed Regeneration of BO-Defects: Improving Long-Term Solar Cell Performance Within Seconds",Proceedings of the 29th European Photovoltaic Solar Energy Conference and Exhibition, Amsterdam, (Sep. 22, 2014)(Sep. 26, 2014) pp. 366-372.
Search Report issued from the European Patent Office for related Application No. 16764058.0 dated Mar. 22, 2019 (37 pages).

100

102 – Exposing a portion of the doped silicon to electromagnetic radiation in a manner such that photons with an energy higher than that of a bandgap of the silicon provide a radiation intensity of at least 3 suns

104 – Controlling a temperature of the silicon by varying the one or more parameters of the radiation during exposure; in a manner such the radiation intensity provided by photons with an energy higher than the bandgap of the silicon is varied while a minimum excess carrier concentration higher than 10% of an effective doping concentration of the exposed portion is maintained in the exposed portion during exposure to the electromagnetic radiation

FIGURE 1

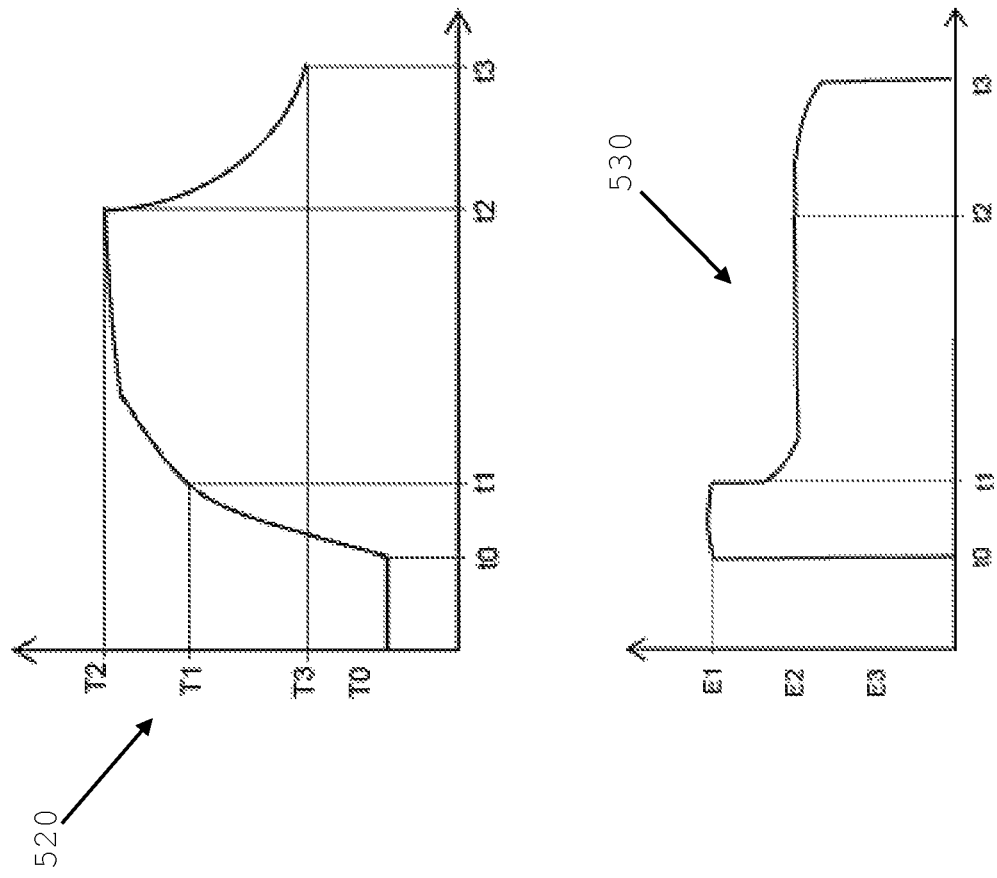
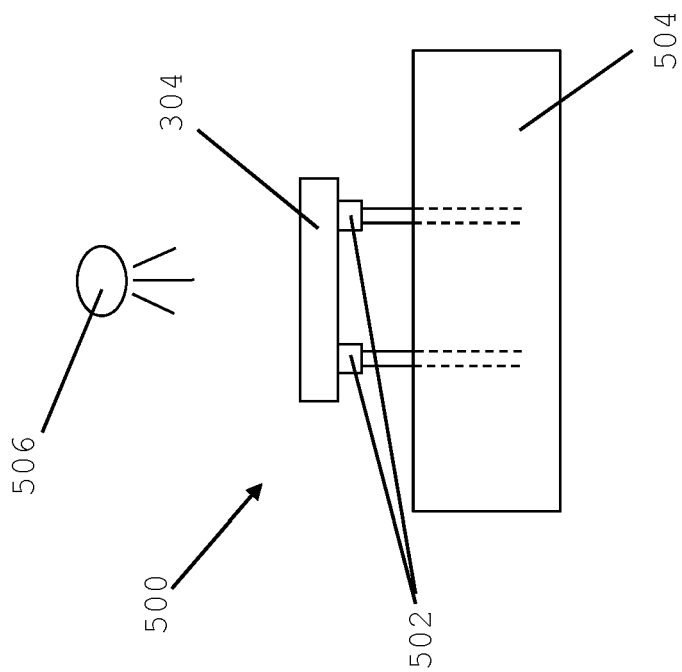
FIGURE 5 (a)
FIGURE 5 (b)

700 

702 - Exposing a portion of the silicon material to electromagnetic radiation such that the portion of the silicon material reaches a temperature between 250°C and 400°C while exposed; the electromagnetic radiation being such that photons with energy higher than a bandgap of the silicon provide a radiation intensity of at least 10 suns

704 - Decreasing a power of the electromagnetic radiation during exposure in a manner such that the radiation intensity provided by photons with an energy higher than the bandgap of the silicon decreases and the temperature of the silicon material drops to a value below 150°C in a predetermined period of time

FIGURE 7

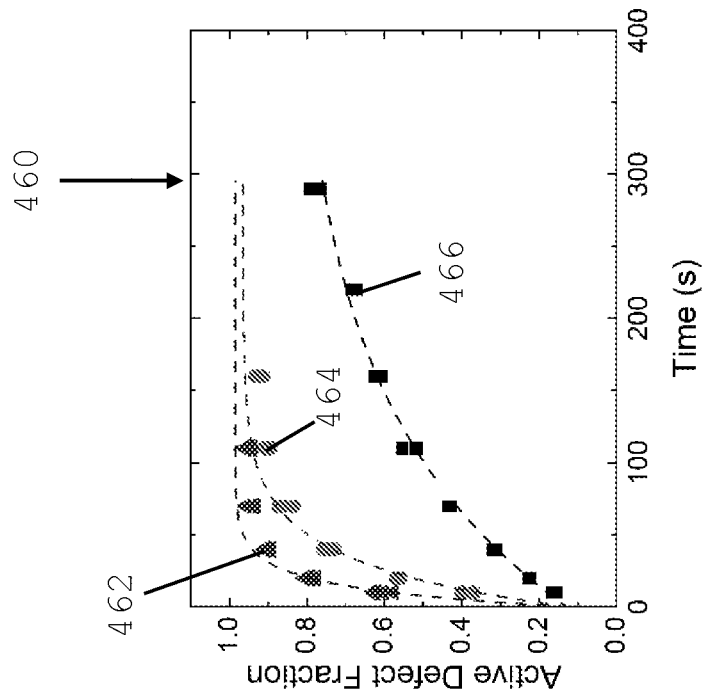
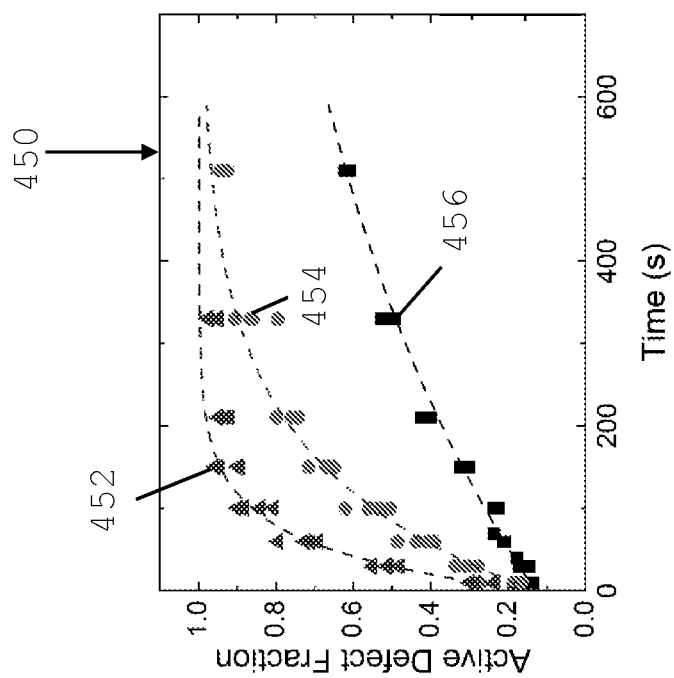
FIGURE 14

METHOD FOR PROCESSING SILICON MATERIAL

FIELD OF THE INVENTION

The present invention generally relates to a method for treating a semiconductor material comprising doped silicon. In particular, the invention relates to a method for forming electrically active defects in silicon solar cells and passivating electrically active defects.

BACKGROUND OF THE INVENTION

Silicon is the main semiconductor material used to fabricate today's commercial solar cells. The majority of commercial solar cells are fabricated from a monocrystalline or polycrystalline silicon wafer. A p-n junction is formed in the silicon wafer by, for example, diffusing n-type atoms in a p-type silicon wafer.

A large amount of solar cells are fabricated using a boron doped wafer (p-type). The boron atoms introduced in the silicon material tend to form boron-oxygen (B—O) complexes. These complexes can form electrically active defects when exposed to radiation, such as visible light. Similarly polycrystalline wafers are known to contain a wide variety of metal impurities which may subsequently change form and introduce recombination centers. Electrically active defects throughout a solar cell affect the lifetime of charge carriers causing reduced performance.

Techniques have been used in the art to reduce the effect of defects in p-type silicon solar cells. However these techniques only apply to defects that are already present in the silicon. Thus any defects that form subsequent to this processing will still adversely impact the solar cell efficiency. P-type Czochralski (Cz) silicon solar cells, for example, are known to suffer from light induced degradation (LID) which may causes a drop in efficiency of up to 3% absolute during the first 24-48 hours of operation. Similarly polycrystalline silicon solar cells have been shown to suffer from a similar light induced degradation in performance, although on a much slower timescale compared to Cz wafers.

Under typical solar cell processing conditions many of these defects have not yet formed. Thus in general these techniques require hours or even days to stabilise the silicon material. This is generally incompatible with the high throughput solar cell manufacturing environment.

For example U.S. Pat. No. 8,263,176 describes techniques to stabilise the performance of solar cells using high temperature. According to U.S. Pat. No. 8,263,176 a light source can approximately accelerate the stabilising treatment process up to a factor of 8. However, under illumination stronger than 1000 W/m$^2$, the acceleration decreases and reaches saturation. The resulting stabilisation process is performed on a hot plate at a temperature of 160° C. The solar cell is illuminated at the same time to generate excess minority carriers. The solar cell is held in this state for about 30 minutes before undertaking further processing, e.g. wiring and encapsulation in modules.

There is a need in the art for a process and equipment capable of stabilising the silicon material by forming the electrically active defects more rapidly.

SUMMARY OF THE INVENTION

In accordance with the first aspect, the present invention provides a method for accelerating the formation of defects in doped silicon, the method comprising the steps of:

exposing a portion of the doped silicon to electromagnetic radiation in a manner such that photons with an energy higher than that of a bandgap of the silicon provide a radiation intensity of at least 3 suns; and wherein one or more parameters of the radiation source are selected in a manner such that a minimum excess majority carrier concentration higher than 10% of an effective doping concentration of the exposed portion is maintained in the exposed portion during exposure to the electromagnetic radiation.

The exposed portion of silicon may comprise n-doped regions and p-doped regions. These regions will have different effective doping concentrations. During exposure a minimum excess majority carrier concentration higher than 10% of the effective doping concentration at each doped region is maintained.

In embodiments, the radiation is such that photons with energy higher than a bandgap of the silicon provide a radiation intensity of at least 10 suns, 30 suns, 50 suns or 70 suns during the exposure period.

The minimum excess majority carrier concentration may be maintained in the doped silicon for at least 90% of the exposure duration at radiation intensity of at least 3 suns and may be at least twofold the effective doping concentration of the silicon.

In some embodiments the method comprises the step of selecting the magnitude of the radiation based on a proportional or quadratic relation with the effective doping concentration or the majority carrier concentration at a region of the exposed silicon. The magnitude of the radiation may be selected in a manner such that the total photon density reaching the exposed portion is higher than $5 \times 10^{17}$ photons/cm$^2$/s.

In embodiments, the method further comprises the step of controlling a temperature of the silicon by varying one or more parameters of the radiation during exposure; in a manner such that the radiation intensity provided by photons with an energy higher than the bandgap of the silicon is varied.

In an embodiment, the steps of exposing a portion of the silicon to the electromagnetic radiation and controlling a temperature of the doped silicon are performed in a manner such that electrically active defects are formed in at least a portion of the doped silicon.

In an embodiment, the steps of exposing a portion of the silicon to radiation and controlling a temperature of the silicon are performed in a manner such that electrically active defects in the silicon are passivated.

In an embodiment, the steps of exposing a portion of the silicon to radiation and controlling a temperature of the silicon are performed in a manner such that electrically active defects are formed in at least a portion of the doped silicon and electrically active defects in the portion are passivated and wherein a passivation rate of the electrically active defects is higher than a formation rate of the electrically active defects.

In embodiments, the steps of exposing a portion of the silicon to radiation and controlling a temperature of the silicon are performed in a manner such that the exposed portion reaches a stabilised condition in a predetermined period of time and, in the stabilised condition, further exposure of the exposed portion to radiation is capable of increasing the concentration of electrically active defects not more than a further 10%.

The predetermined period of time may be selected based on an effective doping concentration of the silicon material, a concentration of p-type dopants in the silicon material, a concentration of n-type dopants in the silicon material; or an effective majority carrier lifetime of the silicon material. The predetermined period of time may be shorter than 20 seconds or shorter than 5 seconds.

In embodiments, the method further comprises the step of cooling the silicon to a cooled temperature. The silicon may be cooled while the silicon is exposed to the radiation. Alternatively, if rapid cooling is required radiation can be switched off while the silicon is cooled.

The step of cooling the silicon may comprise the step of increasing a thermal mass in thermal contact with the silicon or decreasing a thermal resistance between the silicon and a thermal mass. In some instances a thermal contact between the silicon and a heat sink is created.

In embodiments, the cooled temperature is such to minimise reactivation of passivated defects.

The step of cooling the silicon may be performed in a manner such that the silicon reaches the cooled temperature in 10 seconds or less. In one embodiment, the cooled temperature is below 150° C.

In embodiments, the method further comprises the step of pre-heating the silicon to a process initial temperature, wherein the process initial temperature is selected based on one or more properties of the radiation used during the exposure step. In embodiments, the initial temperature is at least 150° C.

In embodiments, the step of controlling the temperature of the silicon comprises the step of increasing the power of the radiation to a first power value during exposure to raise the silicon temperature to a first temperature value.

In embodiments, the step of controlling the temperature of the silicon comprises the step of increasing the power of the radiation to a first power value during exposure to raise the silicon temperature to a first temperature value.

In embodiments, the method further comprises the step of maintaining the silicon temperature at the first temperature value for a first period of time.

In embodiments, the step of controlling the temperature of the silicon comprises the step of decreasing the power of the radiation to a second power value during exposure to drop the silicon temperature to a second temperature value.

In embodiments, the method further comprises the step of maintaining the silicon temperature at the second temperature value for a second period of time.

A thermal mass in thermal contact with the silicon or a variation of thermal resistance between the silicon and a thermal mass may be used to affect the temperature of the silicon during exposure.

In embodiments, the first temperature value is chosen such that the rate of thermal dissociation of B—O defects is higher than the rate of formation of B—O defects in the silicon.

In an embodiment, the first temperature value is comprised between 250° C. and 400° C. or between 260° C. and 350° C.

In an embodiment, the second temperature value is comprised between 250° C. and 300° C.

In an embodiment, the first power value is such that photons with energy higher than a bandgap of the silicon provide a radiation intensity of at least 6 suns.

In an embodiment, the second power value is 60% of the first power value or less.

In embodiments, the first period of time is comprised between 5 and 20 seconds.

In embodiments, the second period of time is comprised between 5 and 20 seconds.

In embodiments, the radiation has a pulsed waveform and the one or more parameters of the radiation varied during exposure comprise one or a combination of: frequency, duty cycle and amplitude of radiation pulse.

The frequency may be selected in manner such that the minimum excess majority carrier concentration is maintained throughout the duration of the pulse. Further, the frequency may be selected to independently control the temperature of the silicon.

In an embodiment, the frequency is maintained between 100 Hz and 1 MHz and the duration is maintained between 1 μs and 10 ms.

In another embodiment, the frequency is maintained between 1 kHz and 100 kHz and the duration is maintained between 10 μs and 1 ms.

In embodiments, the method further comprises the step of providing hydrogen atoms in the semiconductor material. The method may comprise the step of varying at least one parameter of the radiation during exposure to control the amount of hydrogen atoms in a given charge state.

The doped silicon may be part of a boron doped semiconductor wafer and the exposed portion may comprises one or both the surfaces of the wafer. In some embodiments, the doped silicon may be part of a device comprising a rectifying junction, such as a solar cell. In these embodiments the method may comprise the step of applying a voltage waveform across the rectifying junction to generate excess charge carriers and, in some instances, selecting one or more parameters of the voltage waveform to control the generated excess majority carriers.

In embodiments of the method the electrically active defects comprise boron-oxygen defect.

In accordance with the second aspect, the present invention provides a method for stabilising the performance of a photovoltaic cell comprising silicon material, the method comprising the steps of:
    exposing a portion of the silicon material to electromagnetic radiation such that the portion of the silicon material reaches a temperature between 250° C. and 400° C. while exposed; the electromagnetic radiation being such that photons with energy higher than a bandgap of the silicon provide a radiation intensity of at least 10 suns; and
    decreasing a power of the electromagnetic radiation during exposure in a manner such that the radiation intensity provided by photons with an energy higher than the bandgap of the silicon decreases and the temperature of the silicon material drops to a value below 150° C. in a predetermined period of time;
    wherein a minimum excess majority carrier concentration higher than 10% of an effective doping concentration of the doped portion is maintained in the doped portion during the exposure of the doped portion to the electromagnetic radiation.

In accordance with the third aspect, the present invention provides a method of manufacturing a crystalline silicon homo-junction solar cell, the method comprising the steps of:
    providing a doped silicon substrate;
    forming a p-n junction with the silicon substrate by introducing dopants having a polarity that is opposite to that of the silicon substrate; and
    treating at least a portion of the silicon using the method in accordance with the first aspect or the second aspect.

In accordance with the fourth aspect, the present invention provides a silicon solar cell manufactured in accordance with the method of the third aspect.

The methods of the first and second aspects may be selectively applied to a localised portion of a silicon device to improve the performance of a structure disposed at the localised portion.

Advantageous embodiments of the present invention provide a method for rapidly stabilising the bulk lifetime of silicon material, for example in a silicon solar cell. This is achieved through a deliberate and accelerated formation of electrically active defects and hydrogen passivation of electrically active defects. The method uses a very high intensity light (higher than 3 suns) to provide very high injection of majority carriers in the silicon. The same light is used to control the temperature of the silicon during the process in order to accelerate and optimise the defect formation and passivation processes. In particular, in some embodiments the temperature of the silicon is controlled by providing light with an alternate waveform and varying the frequency of the waveform. Temperature control can be facilitated by using thermal masses, which can be moved into contact, or out of contact with the silicon material.

The synergy between the very high intensity light and the temperature control provide the ability to achieve a 90% or better stabilisation of the silicon material in an extremely short period of time. In some embodiments this period of time is shorted than 5 seconds.

BRIEF DESCRIPTION OF THE DRAWINGS

Features and advantages of the present invention will become apparent from the following description of embodiments thereof, by way of example only, with reference to the accompanying drawings in which:

FIGS. 1, 2 and 7 show flow diagrams outlining a series of steps for treating a semiconductor material comprising doped silicon in accordance with embodiments;

FIG. 5 shows schematic illustrations of a solar cell under illumination (a), temperature and illumination profiles (b);

FIGS. 14 to 17 show measurements and simulation data for silicon wafers to be used for solar cell manufacturing treated with methods in accordance with embodiments.

DETAILED DESCRIPTION OF EMBODIMENTS

Figure 2:
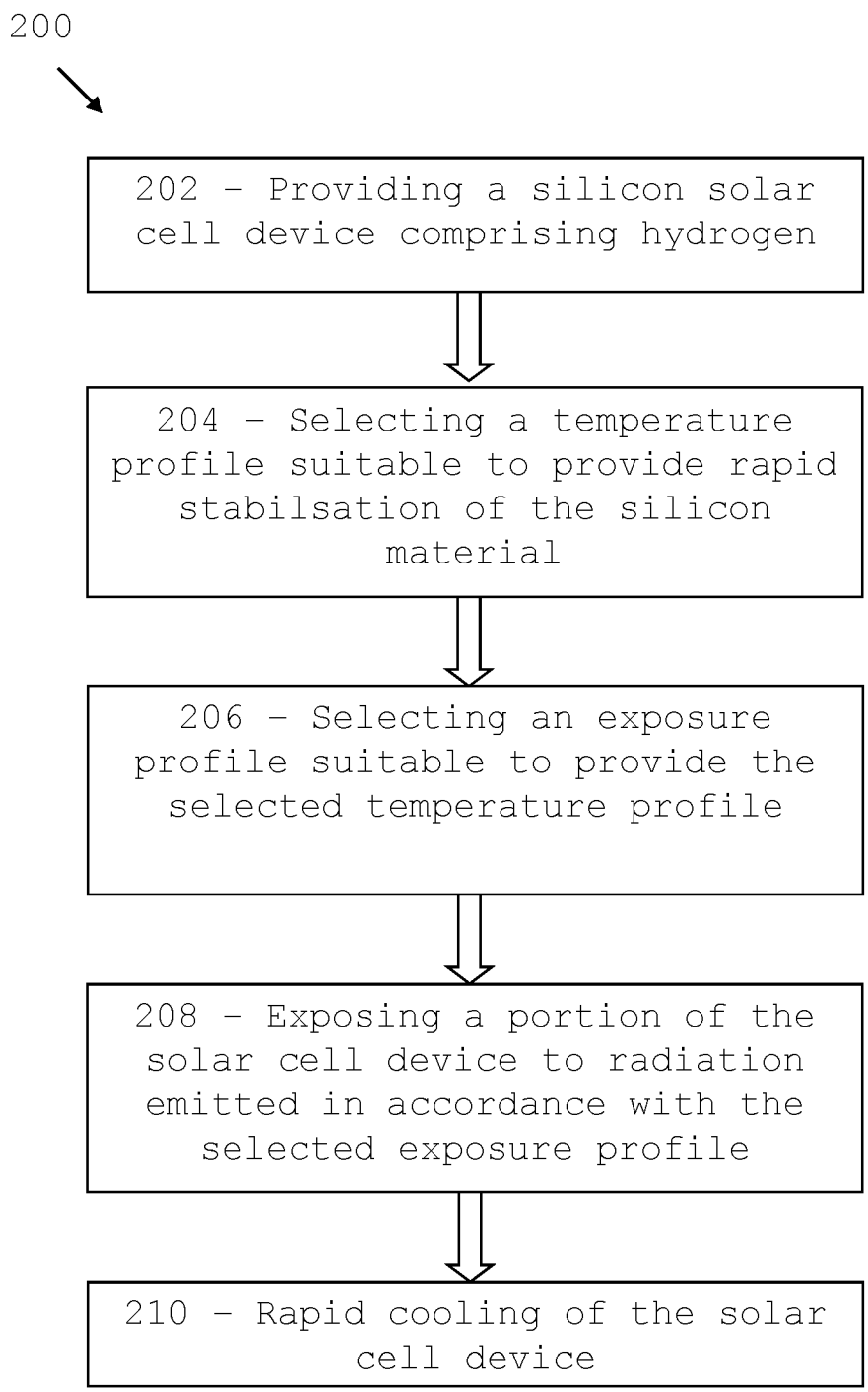

Embodiments of the present invention relate to a method for rapidly stabilising the lifetime of minority carrier in doped silicon material by a deliberate and accelerated formation of electrically active defects and passivation of the defects. The silicon material is exposed to a high intensity radiation. The radiation is absorbed in the silicon material and generates excess minority and majority carriers. In addition, the radiation provides thermal energy to control the temperature of the silicon during the stabilisation process.

The exposure to high intensity radiation and the temperature regimes provided in accordance to embodiments of the invention allow the rapid formation and passivation of electrically defects related to the boron-oxygen complex. A portion of these defects typically has not formed yet when the fabrication of the solar cell is completed. These defects may form when the solar cell is operating in the field—light induced degradation (LID)—causing a drop in absolute efficiency up to 3% absolute.

Embodiments of the present invention are applicable to rapidly stabilise the bulk lifetime of a silicon solar cell by formation of electrically active defects, such as defects that can be associated with the boron-oxygen complex, activation of existing defects and defect passivation. For example, in silicon solar cells manufactured on low quality silicon substrates comprising upgraded metallurgical grade silicon, multi-crystalline silicon or Czochralski silicon, multiple impurity types may be present in the silicon material, which can form recombination active defects over time when subject to carrier injection.

The boron-oxygen defect is associated with two recombination centres forming under light irradiation: a fast-forming and a slow-forming centre. The fast-forming centre is characterised by a very high capture cross section ratio between electrons and holes ($\sigma_n/\sigma_p \sim 100$) while the slow forming defect has a smaller degree of asymmetry ($\sigma_n/\sigma_p \sim 10$). The fast forming defects reach a saturation concentration quickly, while the slow forming defect typically takes 24-48 hours under 1-sun illumination at room temperature. The slow forming defect is ultimately responsible for determining the bulk minority carrier lifetime in the silicon material.

The formation of defects in silicon has been associated with effects of exposure to radiation. However, the defect formation has always been associated with the presence of excess minority carriers. Radiation intensity up to 0.1 suns have shown saturating defect formation rates leading to long (more than one hour) defect formation processes. No further increase of the defect formation rate with modified radiation, without introducing external stimuli, such as temperature, has been reported in the art to date. These findings have been confirmed for B—O defects in p-type silicon.

In contrast to methods proposed in the art, the method proposed herein is designed to generate excess majority charge carriers in the silicon material in a concentration higher than the effective silicon doping concentration. This is achieved using radiation intensities higher than 3 suns and, in specific embodiments, temperatures above 250° C. According to embodiments of the method proposed herein, the stabilisation of the silicon material can be obtained in only a few seconds.

Advantageously, the temperature of the silicon material is controlled by controlling properties of the radiation used to generate the excess majority carriers, for example the 'frequency of the radiation signal'. The expression 'frequency of the radiation signal' herein is used in relation to the waveform of the radiation signal used to expose the semiconductor and not in relation to the actual wavelength of the light used. For example, the silicon material could be exposed using a square wave signal, create by switching a laser on and off at a predetermined frequency. In some embodiments, the frequency is controlled to modulate the energy delivered to the silicon material and the temperature.

The formation and activation of defects related to the B—O complex in the silicon material can take place together with the hydrogen passivation process. Having a source of hydrogen atoms in the silicon allows the passivation of the defects as they are created, or activated, during the exposure.

The temperature control of the silicon allows managing the formation and passivation processes, whilst minimising reactivation of passivated defects. High regime carrier injection is preferably maintained throughout the process.

In contrast with methods previously proposed in the art, embodiments of the method proposed herein use high intensity radiation and fast heating transients. To provide a more accurate temperature control for the devices, the devices are moved in and out of contact with higher or lower thermal masses in order to promote heating or cooling. Alternatively, the thermal resistance between the devices and the thermal masses can be modulated.

Carrier injection may be continued during the cooling down phase to allow a re-passivation of any thermally dissociated hydrogen-defect complexes and the re-formation of any thermally dissociated B—O defect complexes. Even if in the absence of hydrogen, under high intensity illumination at a given temperature, a net dissociation of B—O defects occurs, a rapid formation rate of the B—O defects can also occur. By using similar conditions in the presence of hydrogen, a net passivation of the B—O defects can occur provided that the passivation rate of the B—O defects is faster than the thermal dissociation rate of the B—O defects and the thermal dissociation rate of the hydrogen-defect complex.

In the radiation intensity regimes used in the method, the significant increase to the total majority carrier concentration creates a substantial acceleration in the defect formation rate. For the B—O defect in p-type silicon, for example, the chemical reactions which lead to defect formation appear to be limited by the availability of holes, and hence the effective doping concentration of the material.

The defect formation could be accelerated by simply increasing the effective dopant concentration of the material. However, this would affect device design and generally leads to a higher saturated concentration of the defect. This is undesirable for multiple reasons. Firstly, it can lead to substantially higher performance losses due to a higher concentration of the defects in the material. Secondly, in order to neutralise the recombination activity of the defects, higher concentrations of hydrogen and/or a longer passivation process is required to ensure adequate passivation of the defects.

Given the high radiation intensities used in the process and relatively high temperatures, a rapid cooling phase is also necessary. The rapid cooling is achieved in some embodiments by removing the radiation source and actively cooling the device. For example, by placing the device in contact with a high thermal mass member or heat-sink.

Referring now to FIG. 1, there is shown a flow diagram 100 with steps required to form electrically active defects in the silicon material. After providing an electronic device, or simply a silicon substrate with specific doping properties and carrier lifetimes, an exposure step (102) to a radiation source with energy higher than 3 suns is performed. The radiation contains energy higher than 3 suns at wavelengths which are absorbed by the silicon material. The high intensity of the radiation allows heating of the silicon material and induces high injection of majority carriers in the material.

At step 104, and throughout the exposure, the temperature of the silicon is controlled to provide optimal defect formation and/or activation and promote passivation of electrically active defects. The temperature of the silicon is controlled by varying one or more parameters of the radiation and, at the same time, maintaining an excess charge carrier concentration higher than 10% of the effective doping concentration of the silicon material. Depending on the process time available a different excess charge carrier concentration can be selected.

In boron doped Czochralski silicon, illumination intensities in excess of $1.68 \times 10^{19}$ photons/cm$^2$/s can be used to complete the defects formation process in less than 1 minute. The high intensity radiation allows increasing the temperature of the silicon very rapidly to a value of 423 K.

A pulsed radiation source can be used to modulate the amount of energy delivered to the silicon material. By modulating the frequency of the radiation source the temperature of the silicon can be increased or decreased, which preserving injection conditions.

Referring now to FIG. 2, there is shown a flow diagram 200 with a series of steps required to stabilise the performance of a solar cell. A silicon solar cell is provided (step 202) and a suitable illumination profile is designed based on doping concentration and carrier lifetime in the solar cells and desired process temperature gradients (step 204).

The exposure and temperature profiles are selected at step 206 by taking into account dynamics of the defect formation process and the passivation process for the specific devices, including the amount and charge of hydrogen atoms present in the device. The solar cell is then exposed to radiation based on the selected profiles at step 208 and cooled down at step 210.

Figure 3:
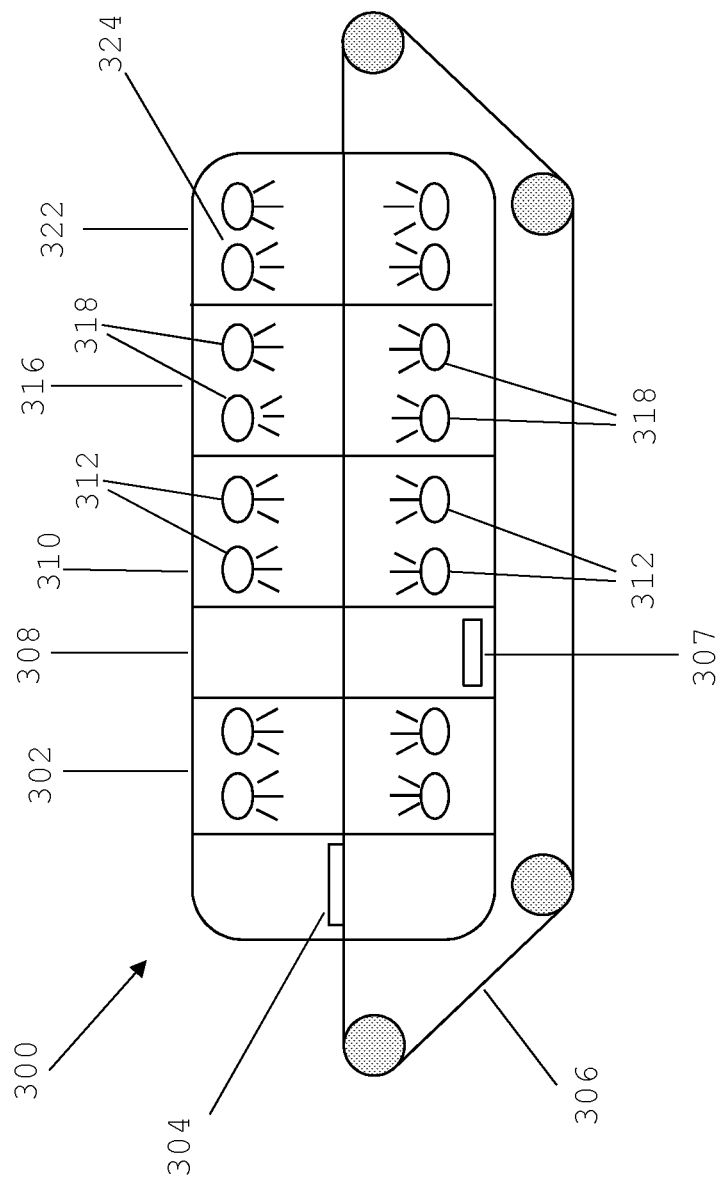
FIGS. 3 and 6 and 13 are schematic illustrations of an apparatus suitable to perform the methods of FIGS. 1 and 2.

Referring now to FIG. 3, there is shown a schematic illustration of an apparatus 300 suitable to perform method 200. In the example of FIG. 3, the defect formation and passivation processes are incorporated in the cool-down process for the formation of screen-printed metal contacts onto the solar cell. After the firing zone 302, the solar cell 304 is transported through the furnace on a belt 306 into the cool down in zone 308. Section 308 comprises a cooling system 307, which brings solar cell 304 to an initial temperature of at least 150° C. in order to begin the defect formation/passivation process in zones 310 and 316. In zones 310 and 316 solar cell 304 is illuminated by light sources 312 and 318 based on an illumination profile. The temperature of solar cell 304 is controlled using the light to follow the profile and facilitate formation and/or passivation of the defects.

Light sources 312 and 318 can provide a light intensity such that photons with energy higher than a bandgap of the silicon provide a radiation intensity between 10 and 70 suns. The frequency of the light can be modulated in both zones 310 and 316 to control the temperature of solar cell 304 while maintaining a minimum excess majority carrier concentration higher than 10%, preferably twofold, of the effective doping concentration of the doped silicon regions in solar cell 304. Zones 310 and 316 can be configured to expose solar cell 304 during different periods of the temperature time profile. In this embodiment, solar cell 304 reaches temperatures comprised between 260° C. and 350° C. in zone 310 and temperatures comprised between 250° C. and 300° C. in zone 316. The entire defect formation/passivation process takes place in a time period shorter than 10 seconds.

In an alternative embodiment, zones 310 and 316 can be grouped in a single zone one set of light sources.

The solar cell 304 is then transported to a cooling zone 322. In zone 322 the solar cell is still illuminated by light source 324, which has a reduced time-averaged intensity than in zones 310 and 318, as well as providing cooling 326 to bring solar cell 304 to a temperature such to minimise reactivation of passivated defects. The cooled temperature is below 150° C. and is reached in zone 322 in 10 seconds or less.

Cooling in zone 322 may be achieved through active cooling by means of conduction, convention or radiation 326 or just by a time-averaged reduction of light intensity 324. In some embodiments, in zone 322, solar cell 304 may be positioned in contact with a heat-sink to accelerate cooling.

In apparatus 300 the radiation can be provided from both sides of the solar cell or a single side of the solar cell, depending on the type of solar cell and which region of silicon has to be passivated.

In an alternative embodiment, the defect formation process is incorporated into the metal annealing process for plated contacts. In this case an initial heating stage of the apparatus is provided before the solar cell 304 enters defect formation zone 310 directly. In this instance, a metal annealing process is performed in zones 310 and 316.

Figure 4:
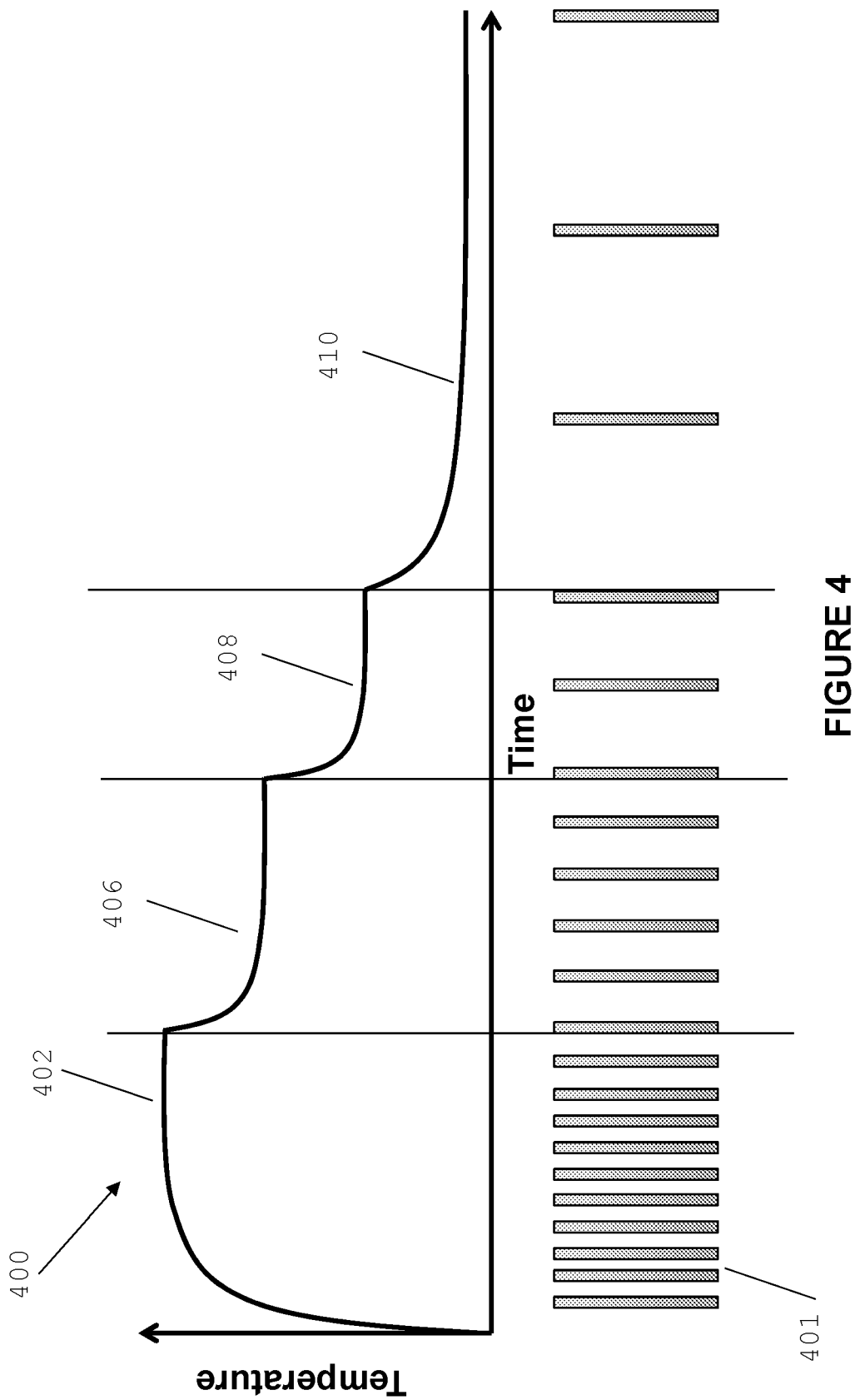
FIG. 4 is a schematic plot of a time dependent solar cell temperature profile used during the method.

Referring now to FIG. 4, there is shown a schematic plot 400 of a time dependent solar cell temperature profile during the defect formation/passivation process and respective light pulses 401. In the embodiment of FIG. 4 the light is pulsed at different frequencies to control the temperature of the solar cell. In zone 402 the temperature is increased to a value comprised between 260° C. and 350° C. by providing a pulsed light with a higher frequency. The temperature is maintained constant for a certain period of time and is then dropped a first time in zone 406 and a second time in zone 408 by reducing the frequency of light pulses 401. Lower frequency pulses are provided during the solar cell cooling down phase 410 to maintain a certain level of carrier generation and to minimise reactivation of passivated defects.

In alternative embodiments, other parameters of the radiation may be used to control the temperature of the solar cell. For example, pulses with a higher average intensity, longer pulses of pulses with a different spectral content may be used.

FIG. 5 shows schematic illustrations of a solar cell under illumination (a), temperature and illumination profiles (b), which can be used to implement a temperature variable process. Arrangement 500 can be used to rapidly cool the solar cell. The cell is placed on a processing stage 502 with a first thermal mass. Another stage 504 of a larger thermal mass is positioned below stage 502. The thermal resistance from solar cell to stage 502 is larger than the thermal resistance from cell to stage 504.

FIG. 5(b) shows a possible temperature profile 520 and a possible average intensity diagram of the radiation 530 which can be used with arrangement 500.

At time $t_0$ (FIG. 5b), the wafer is at temperature $T_0$, and high intensity illumination (with power $E_1$) is provided from illumination source 506. Cell 304 is heated until time $t_1$ when it reaches a predetermined temperature $T_1$. At time $t_1$ the power is reduced to a level $E_2$ to maintain a temperature within a given range $T_1$ to $T_2$. During this period carrier injection allows the formation and passivation of the electrically active defects. At time $t_2$, cell 304 is moved into contact with stage 504 and begins to cool rapidly. During cooling cell 304 is maintained under illumination $E_2$. Further cooling may be provided by other means including, but not limited to, cool air blowing over the surface of the cell 304. During this time, the power may be reduced from $E_2$ to another predetermined value $E_3$, until the cell temperature is reduced to $T_3$.

Frequencies between 100 Hz and 1 MHz can be used, with pulse duration between 1 µs and 10 ms can be used to control the cell temperature. The pulsed light sources may include flash lamps with a broad spectrum of wavelengths, which includes at least one wavelength between 800 nm and 1200 nm.

For example, assuming a pulse energy independent by the frequency, by halving the duty cycle of the pulsed waveform, a reduction in heating of approximately 50% is obtained. By using a short time between successive pulses (such as 1 µs) in relation to the carrier lifetime (for example 100 µs), essentially no loss of carrier concentration will result.

Figure 6:
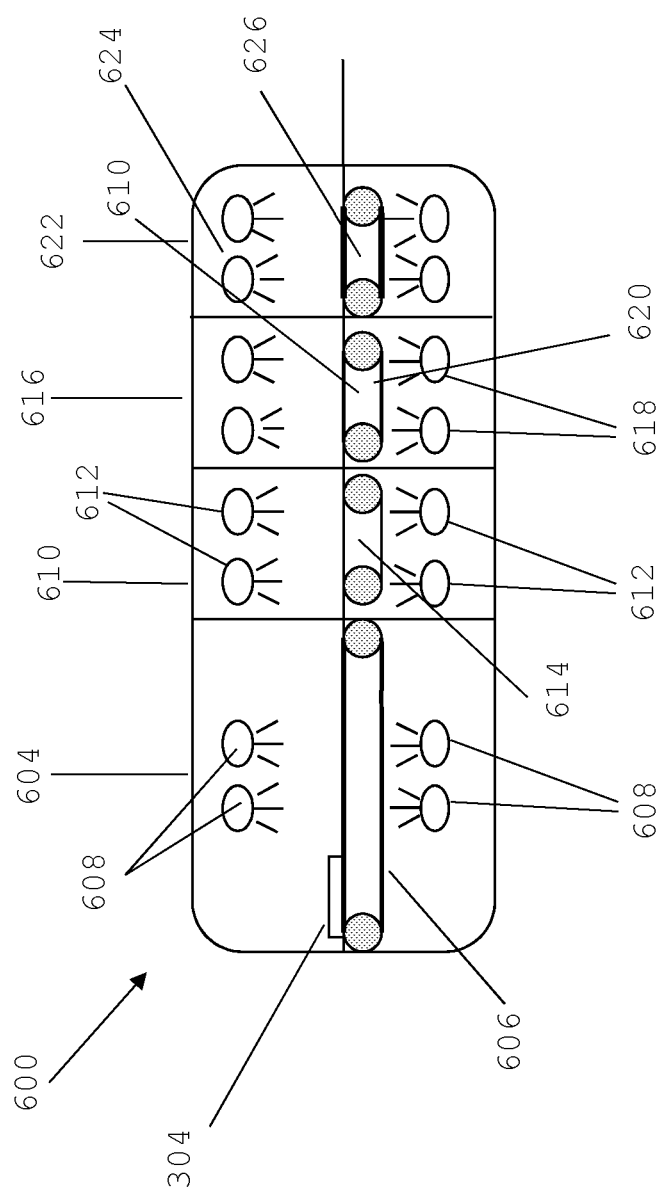

Referring now to FIG. 6, there is shown a schematic illustration of another apparatus 600 suitable to perform method 200. As in the example of FIG. 3, also in apparatus 600 the defect formation and passivation processes are incorporated in the cool-down process for the formation of screen-printed metal contacts onto the solar cell. However, in apparatus 600, solar cell 304 is transported on a series of independent belts. The belts may be operated with independent speeds have different thermal masses.

Upon exiting the firing zone, solar cell 304 is transported into an initial pre-heating/cooling zone 604 using belt 606. Depending on whether the cell has to be heated or cooled in this zone, belt 606 can be designed to have a high or low thermal mass. For example, if zone 604 is positioned after the firing zone, solar cell 304 has to be cooled in zone 604 and belt 606 can be designed to have a high thermal mass, as indicated by the thickened lines in FIG. 6.

In the case where the solar cell has to be pre-heated in zone 608, the transfer of the solar cell to the high illumination zone 610 takes place quickly to reduce the loss of heat from the cell.

Zone 604 can be designed to bring solar cell 304 to an initial temperature of at least 150° C. in order to begin the defect formation/passivation process in zones 310 and 316. In some embodiments, in zone 604 the solar cell can be illuminated by light sources 608 to start generating excess majority carriers.

Zones 610 and 616 can be used to expose solar cell 304 to different illumination regimes using light sources 612 and 618 and different belts 614 and 620 to implement a temperature profile similar to the one described with reference to FIG. 4.

The solar cell 304 is then transported to a cooling zone 622. In zone 622 the solar cell is still illuminated by light source 624, which has a reduced time-averaged light intensity, compared to zones 610 and 618. In zone 622 solar cell 304 is transported using a belt 626 with a very high thermal mass to facilitate cooling. In some embodiments, solar cell 304 is not exposed to light while in cooling zone 622 to facilitate cooling.

Alternative embodiments of the apparatus may comprise a combination of solutions for heating and cooling taken from apparatus 300 and 600. For example, a possible apparatus may have independent belts in addition to active cooling elements. Another alternative includes a series of rollers disposed next to each other, which can be independently actively cooled or heated.

In a further alternative embodiment, the defect formation process may be incorporated into the metal annealing process for plated contacts. In this case an initial heating stage of the apparatus is provided before the solar cell 304 enters defect formation zone 310 or 610 directly. In this instance, a metal annealing process is performed in zones 310 or 610 and 316 or 616.

In a further alternative embodiment, process 200 can be performed during the encapsulation of the solar cells. A possible configuration of a processing tool which could be used to perform process 200 during encapsulation is shown in FIGS. 25 and 26 of PCT/AU2014/050147 owned by the present applicant.

Referring now to FIG. 7, there is shown a flow diagram 700 outlining a series of steps for treating a semiconductor material comprising doped silicon in accordance with embodiments. At step 702 a portion of the silicon material is exposed to electromagnetic radiation such that the portion of the silicon material reaches a temperature between 250° C. and 400° C. while exposed; the electromagnetic radiation being such that photons with energy higher than a bandgap of the silicon provide a radiation intensity of at least 10 suns. Then, at step 704 a power of the electromagnetic radiation is decreased during exposure in a manner such that the radiation intensity provided by photons with an energy higher than the bandgap of the silicon decreases and the temperature of the silicon material drops to a value below 150° C. in a predetermined period of time.

Figure 8:
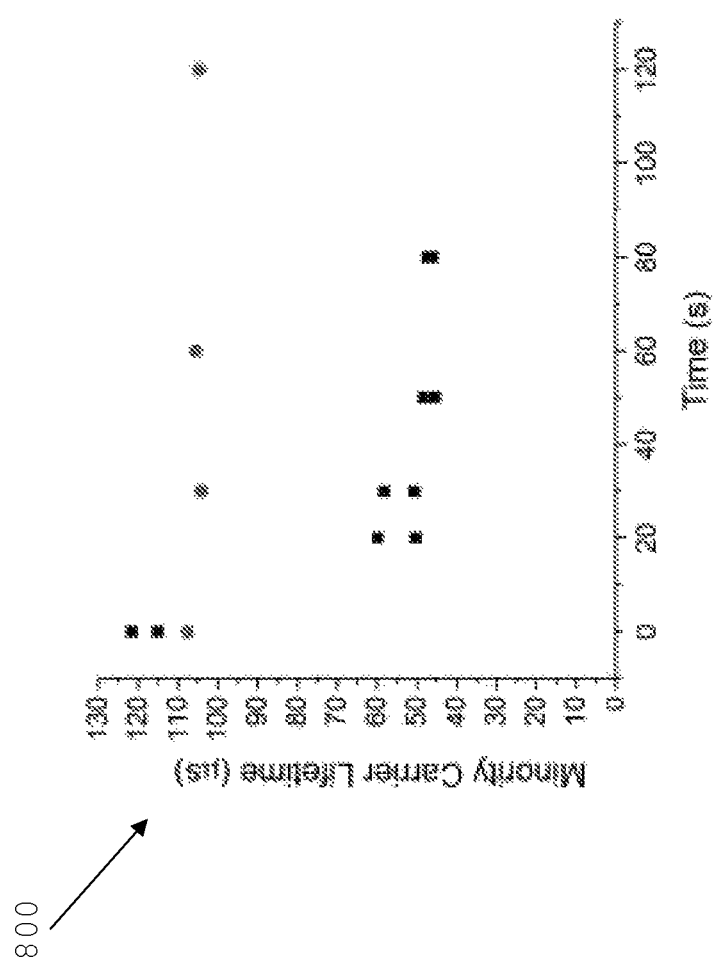
FIG. 8 shows a plot of the minority carrier lifetime as a function of time for two different illumination regimes.

FIG. 8 shows a plot 800 of a defect formation or silicon degradation process. The plot shows how the minority carrier lifetime degrades as a function of time at an injection level of $2 \times 10^{14}$ cm$^{-3}$ for samples annealed at 182° C. The squares represent samples annealed under an illumination intensity of 50 suns in accordance with embodiments, while the circles represent samples annealed under an illumination intensity of 1 sun. Plot 800 clearly shows that samples annealed under an illumination intensity of 1 sun do not degrade with time at this temperature, while the samples illuminated with 50 suns degrade rapidly. The dissociation of the boron-oxygen defect may be more rapid than the defect formation under 1 sun illumination, leading to a net dissociation of the defect. Under 50 suns illumination however the defect formation rate is significantly enhanced, to the extent that it is now greater than the dissociation rate and the net effect is fast defect formation.

Figures 9A, 9B:
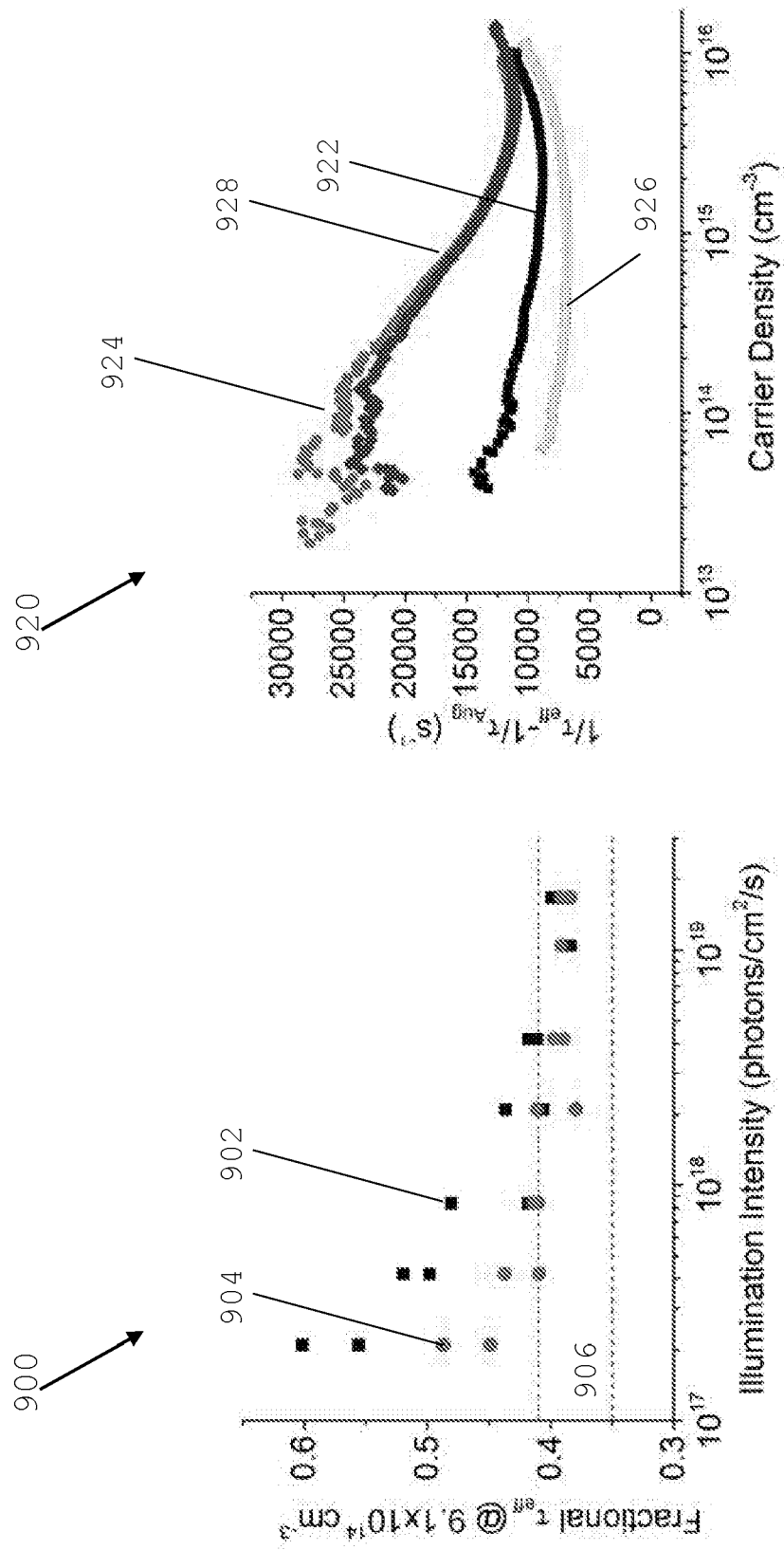
FIGS. 9 and 10 show effective lifetime data measured for a doped silicon wafer processed in accordance with embodiments.

Referring now to FIG. 9, there is shown the effective lifetime in a doped silicon wafer, plot 900, processed in accordance with method 200.

The minority carrier measured at a minority density of $9.12 \times 10^{14}$/cm$^3$ as a fraction of minority carrier lifetime at the same injection level when all defect are thermally dissociated (non-active).

Plot 900 shows the effective lifetime after a 1 minute laser process (902) and after an additional 1 minute laser process (904) at 423 K, as a function of illumination intensity. The stabilised lifetime of these wafers after 48 hours light soaking varies between the dashed lines in the region 906. Plot 920 shows the Auger corrected inverse effective lifetime plotted against excess minority carrier concentration for a sample before processing (922), after laser degradation with an illumination intensity of $1.68 \times 10^{19}$ photons/cm$^2$/s (924), after subsequent dark anneal (926) and after 48 hour light soaking (928).

Figure 10B:
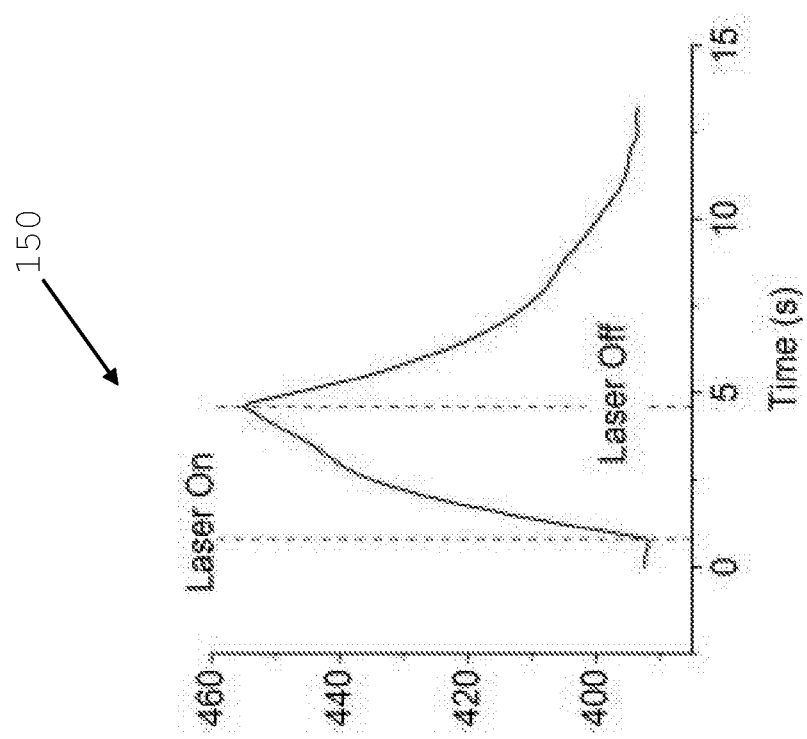
Figure 10A:
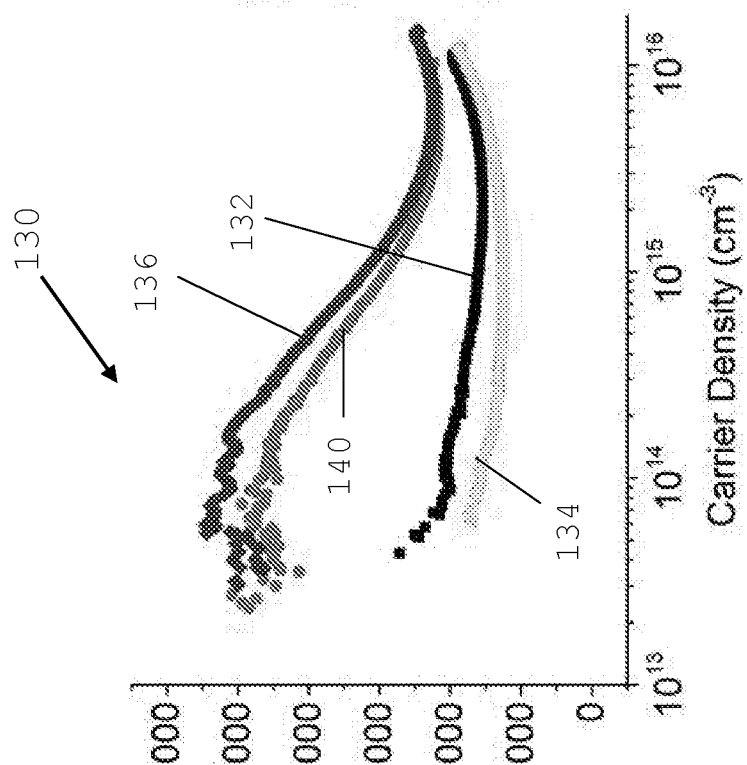

Referring now to FIG. 10, there is shown the Auger corrected inverse effective lifetime, plot 130, as a function of minority carrier density for doped silicon wafer under a given temperature profile. The inverse lifetimes are given before laser degradation (132), after laser degradation with an illumination intensity of $1.68 \times 10^{19}$ photons/cm$^2$/s and a temperature profile as shown in plot 150 (140), after dark annealing (134) and finally after 48 h light soaking (136). The sample temperature profile is shown in plot 150 and is measured using a Datapaq Q18 profiler. The laser is turned on at 0.8 s and turned off at 4.6 s.

Figure 11:
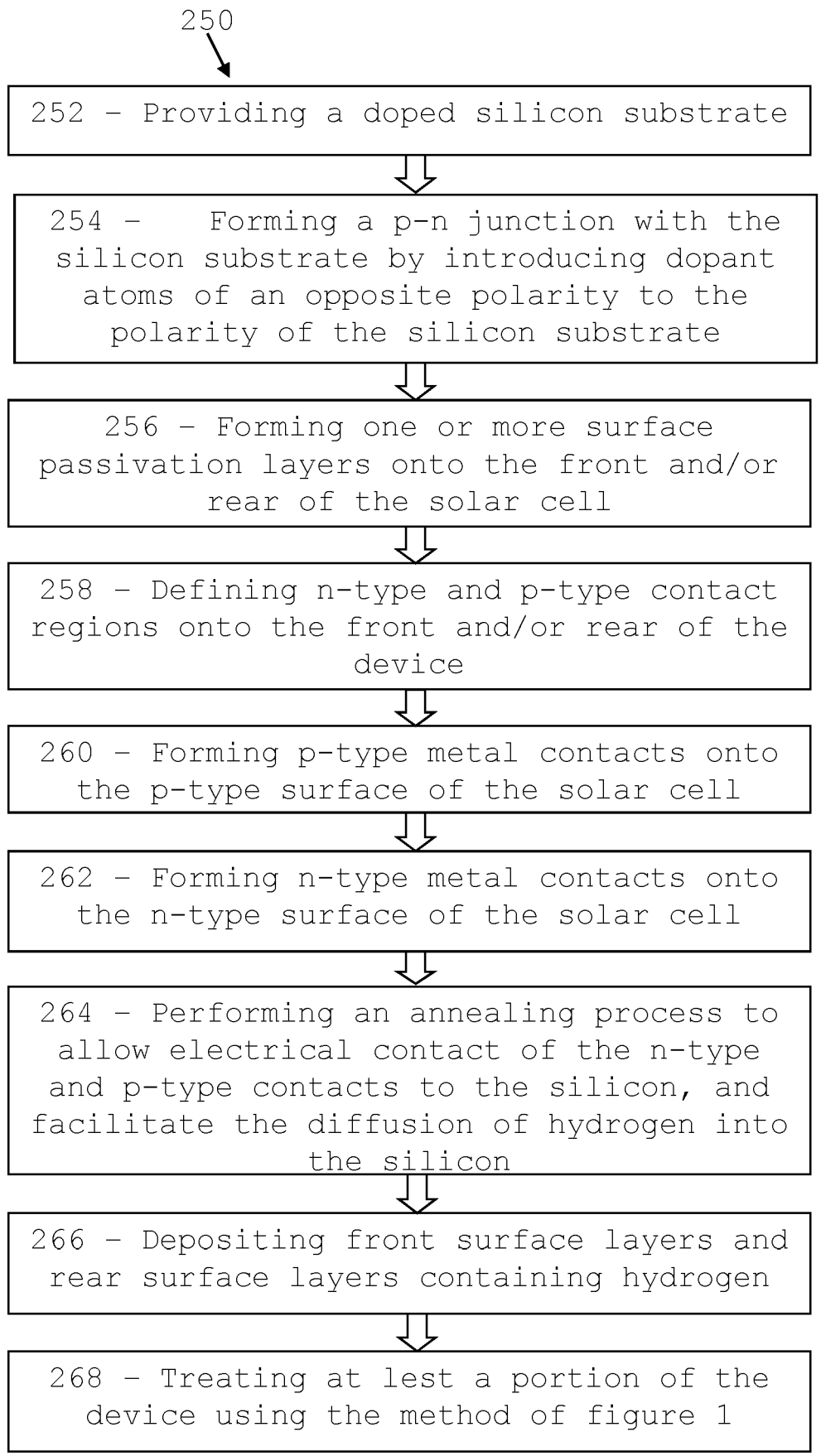
FIG. 11 shows a flow diagram outlining a series of steps for manufacturing a crystalline silicon homo-junction solar cell in accordance with an embodiment.

Referring now to FIG. 11, there is shown a flow diagram 250 outlining a series of steps for manufacturing a crystalline silicon homo-junction solar cell in accordance with an embodiment. A doped silicon substrate is provided at step 252. A p-n junction is successively formed in the silicon substrate by introducing dopants atoms to create a p-type surface and an n-type surface (step 254). One or more surface passivation layers are deposited onto the front and/or rear of the solar cell (256). N-type and p-type contact regions are defined onto the front and/or rear of the device (258). P-type metal contacts are deposited onto the p-type surface of the solar cell (260). n-type metal contacts are deposited onto the n-type surface of the solar cell (262). An annealing process is performed to allow electrical contact of the n-type and p-type contacts to the silicon, and facilitate the diffusion of hydrogen into the silicon (264). Front surface layers and rear surface layers are deposited onto the solar cell, which may consist of metal contacts and/or passivation layers (266). Preferably one or more passivation layers contain hydrogen. Hydrogen atoms can be introduced in the solar cell device at any time during the process sequence, but are typically incorporated during a firing process for the metal contacts. Finally, the device is passivated performing steps in accordance with embodiments of the methods described herein. The methods and processes disclosed allow accelerating formation and passivation of electrically active defects in doped silicon material. The defect formation and passivation rates obtained by using these methods and processes allow full defect formations in a timeframe of seconds.

Figure 12:
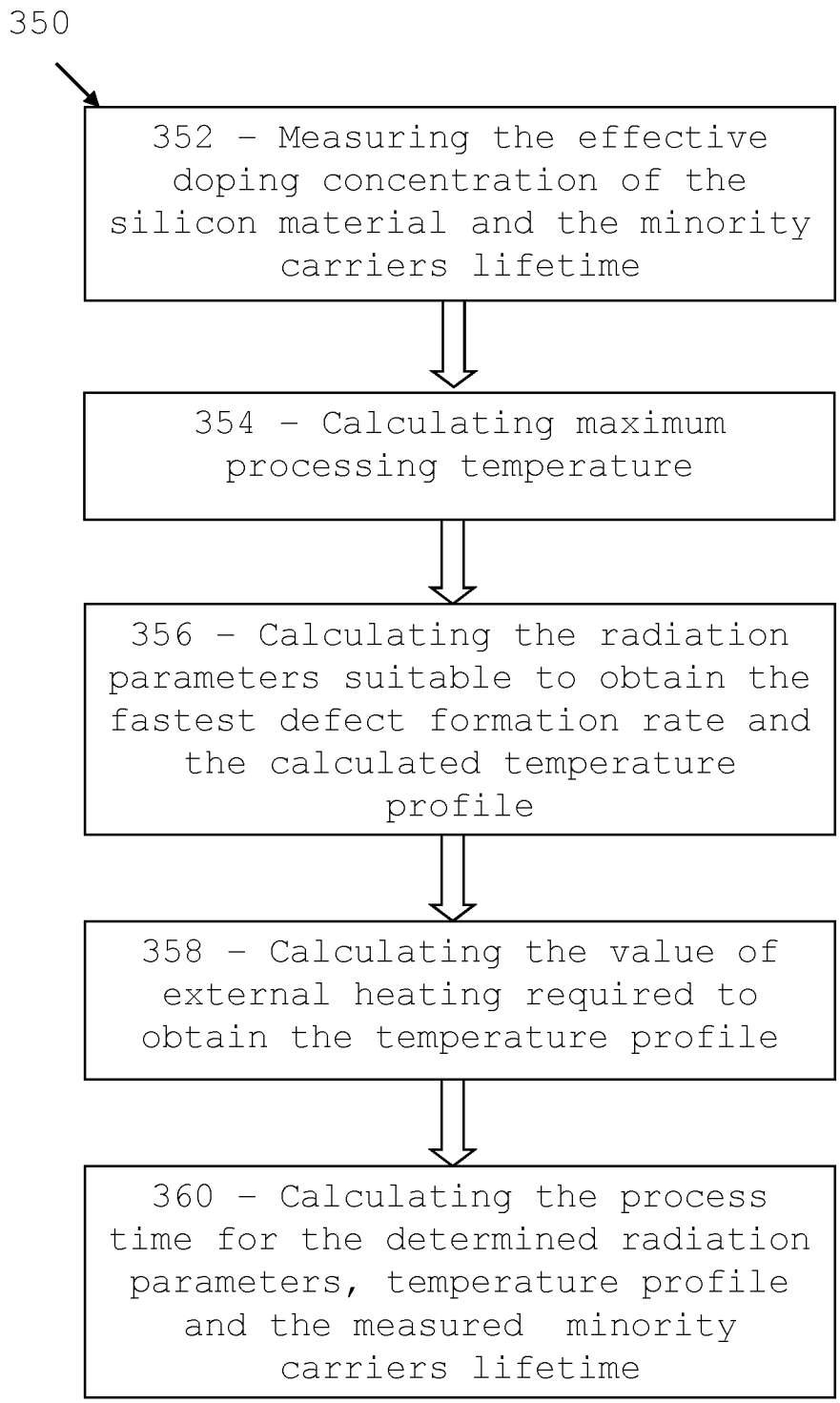
FIG. 12 shows a flow diagram listing a series of steps to derive radiation parameters for illumination.

FIG. 12 shows a flow diagram listing a series of steps that can be used to calculate processing parameters in accordance with an embodiment. The effective doping concentration of the silicon material and the minority carrier lifetime are measured at step 352. The maximum processing temperature is then calculated at step 354. The radiation parameters suitable to obtain the fastest defect formation rate and the calculated temperature profile are calculated at step 356. The amount of external heating required to obtain the determined temperature profile is calculated at step 358. Finally, the process time is calculated at step 360. The calculation of the process time is based on the determined radiation parameters, temperature profile and the measured minority carrier lifetime.

Figure 13:
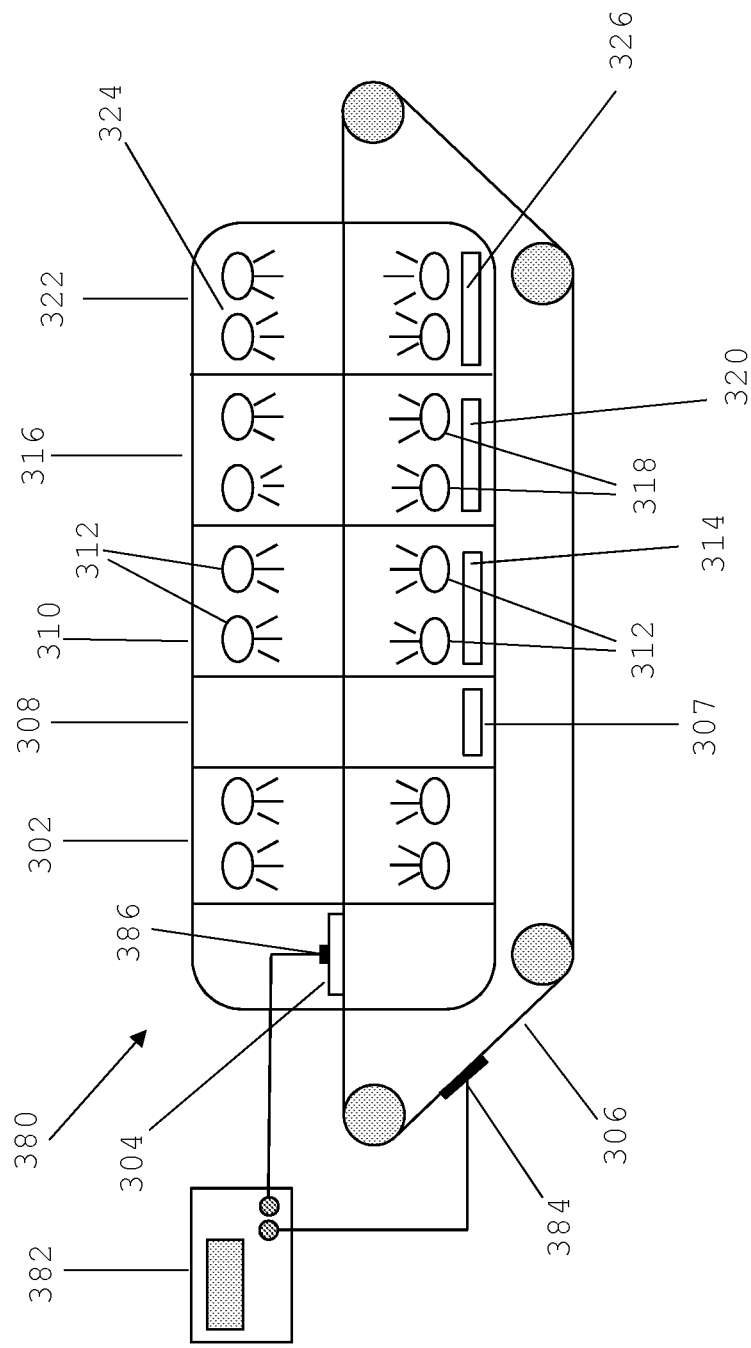

Referring now to FIG. 13, there is shown a schematic illustration of an apparatus 380 suitable to perform method 700. The apparatus 380 is similar to the belt furnace of FIG. 3 but includes a voltage waveform generator 382. In apparatus 380 the applied voltage is used in cooperation with radiation sources 312, 318 and 312 and external heating generators 314 and 320. In the example of FIG. 13, generator 382 is connected to 306, and so to the back side of solar cell 304, through a system of brushes 384 and to the front side of the solar cell through an electrode 386. However, alternative configurations may be used to connect generator 382 to solar cell 304.

In order to observe the dependence of BO defect formation rate on solar cell devices. Unfired solar cell samples were processed at temperatures between 374-417 K under a range of illumination intensities.

FIG. 14 shows plots of the calculated fraction of active defects for unfired wafers after an annealing processes under photon fluxes between $6.7 \times 10^{17}$ and $1.9 \times 10^{19}$ photons/cm$^2$ for a temperature of 374 K (450) and 417 K (460). The dashed lines represent fits to the data using a constant defect formation rate. The triangles (452, 462) are related to a photon flux of $1.9 \times 10^{19}$; the circles (454, 464) are related to a photon flux of $4.9 \times 10^{18}$ and the squares (456, 466) are related to a photon flux of $6.7 \times 10^{17}$.

Data fitting was performed with a simple model including both defect formation and dissociation and a constant defect formation rate. The influence of the fast defect formation process was accounted for by an offset in the initial defect concentration. This offset was a uniform 13% of the saturated defect concentration in all cases. The resulting defect formation rates are reported in Table I.

| Photon Flux (photons/cm²) | 374K | 393K | 417K |
|---|---|---|---|
| $6.71 \times 10^{17}$ | $1.67 \times 10^{-3}$ | $3.65 \times 10^{-3}$ | $6.09 \times 10^{-3}$ |
| $4.88 \times 10^{18}$ | $6.56 \times 10^{-3}$ | $1.46 \times 10^{-2}$ | $3.18 \times 10^{-2}$ |
| $1.32 \times 10^{19}$ | $1.86 \times 10^{-2}$ | $3.40 \times 10^{-2}$ | $7.36 \times 10^{-2}$ |

The use of a constant defect formation rate in the calculation may introduce an error in cases where the majority of defects are in an active state.

It was not possible to obtain a reasonable fit for the data in Table 1 using a linear relationship between p and the defect formation rate. In contrast, an excellent fit could be obtained using a quadratic relationship. Furthermore, when the quadratic pre-factors were plotted on an Arrhenius graph, an activation energy $E_A$ of 0.415±0.02 eV was obtained, which is within the range of the activation energy for defect formation estimated in the literature.

Figure 15:
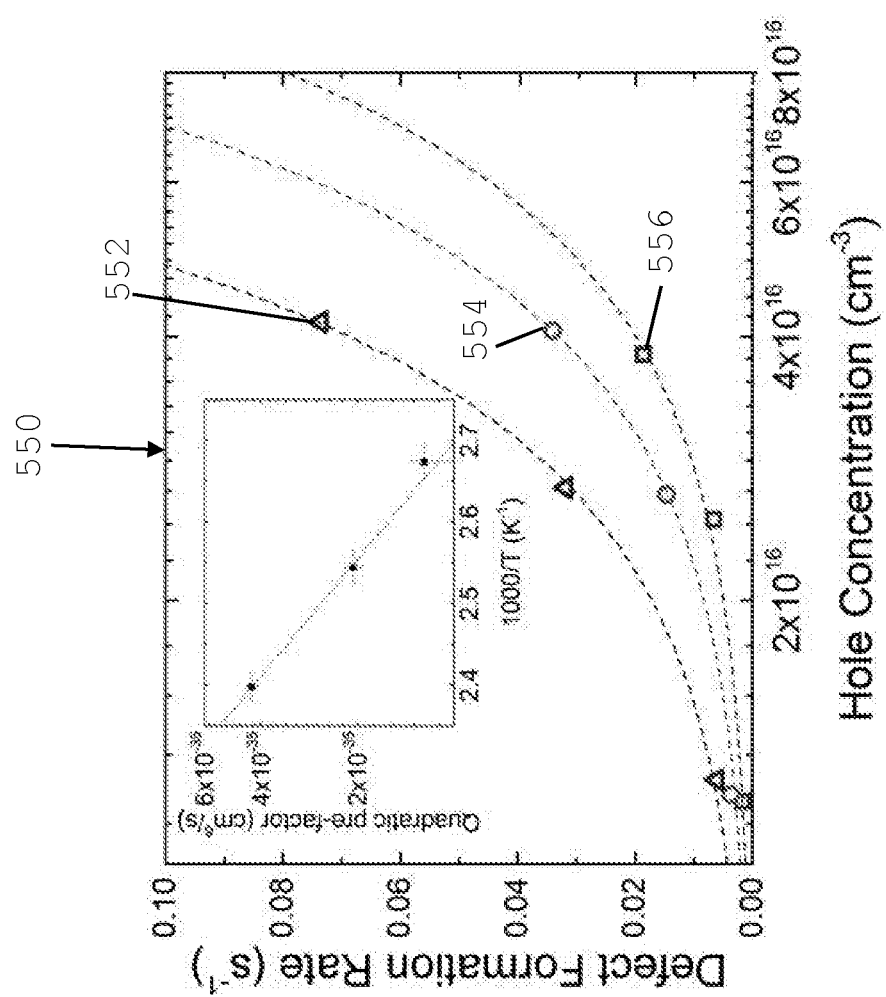

FIG. 15 shows a plot 550 and an Arrhenius plot (inset) with the fitted defect formation rates as a function of calculated hole concentration for temperatures between 374 K and 417 K. The triangles (552) show data for 417 K; the circles (554) show data for 393 K and the squares (556) show data for 374 K.

are related to a photon flux of $1.9 \times 10^{19}$.

The data appear to show that the formation rate of the BO defect has a quadratic dependence upon p at medium to high injection levels in p-type silicon and may be expressed as:

$$R_{formation} = C p^2 e^{-E_A/kT}$$

Where C is a carrier concentration and temperature independent pre-factor under these conditions in p-type silicon. This expression is not a sufficient description at low injection levels, since defect formation is not observed without carrier injection.

A quadratic dependence implies that the defect formation rate may be significantly enhanced when Δn in excess of the bulk effective doping concentration are realized.

Figure 16:
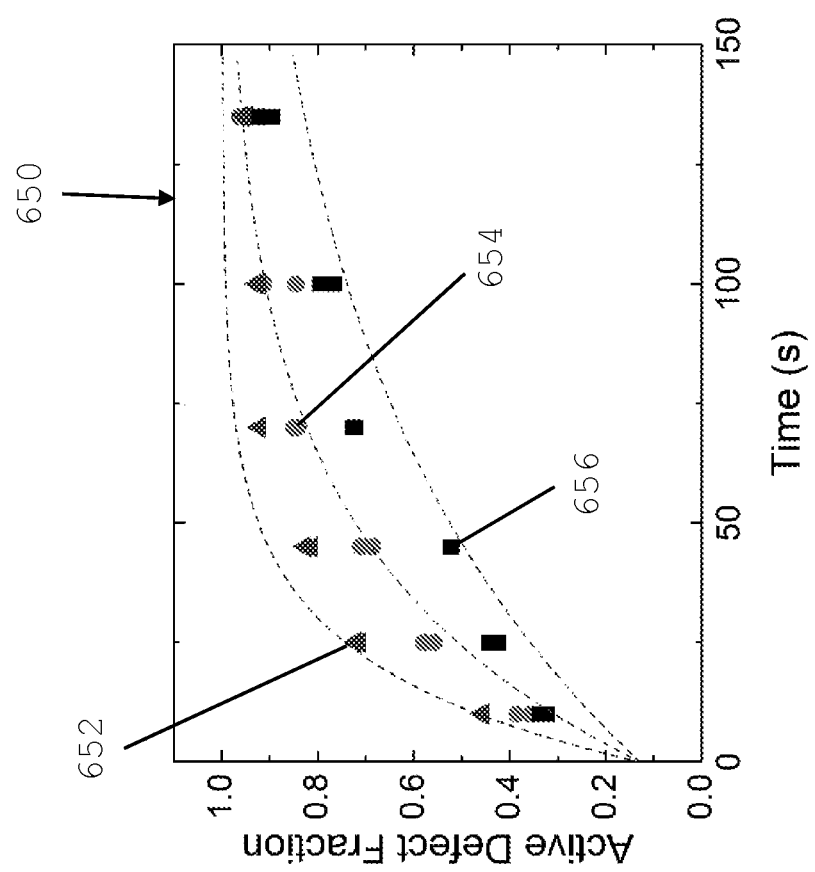

Referring now to FIG. 16, there is shown a plot with the active defect fractions of unfired wafers after annealing processes for $J_0$ between 40 and 455 fA/cm² with a photon flux of $1.09 \times 10^{19}$ photons/cm² at a temperature of 374 K. The dashed lines are data simulated using the calculated hole concentrations and the activation energy and pre-factor determined from the results FIG. 15. The triangles (652) show data for $J_0$=43±3 fA/cm²; the circles (654) show data for $J_0$=177±8 fA/cm² and the squares (556) show data for $J_0$=430±25 fA/cm².

Due to the different effective lifetimes of the samples under injection the excess carrier densities, and hence hole concentrations, decrease with increasing $J_0$. FIG. 15 shows that there is reasonable agreement between the experimental results and this simple model based on quadratic dependence. However the inaccuracy of using a single defect formation rate throughout the process is clearly visible in the fit to the samples with the lowest $J_0$.

Figure 17:
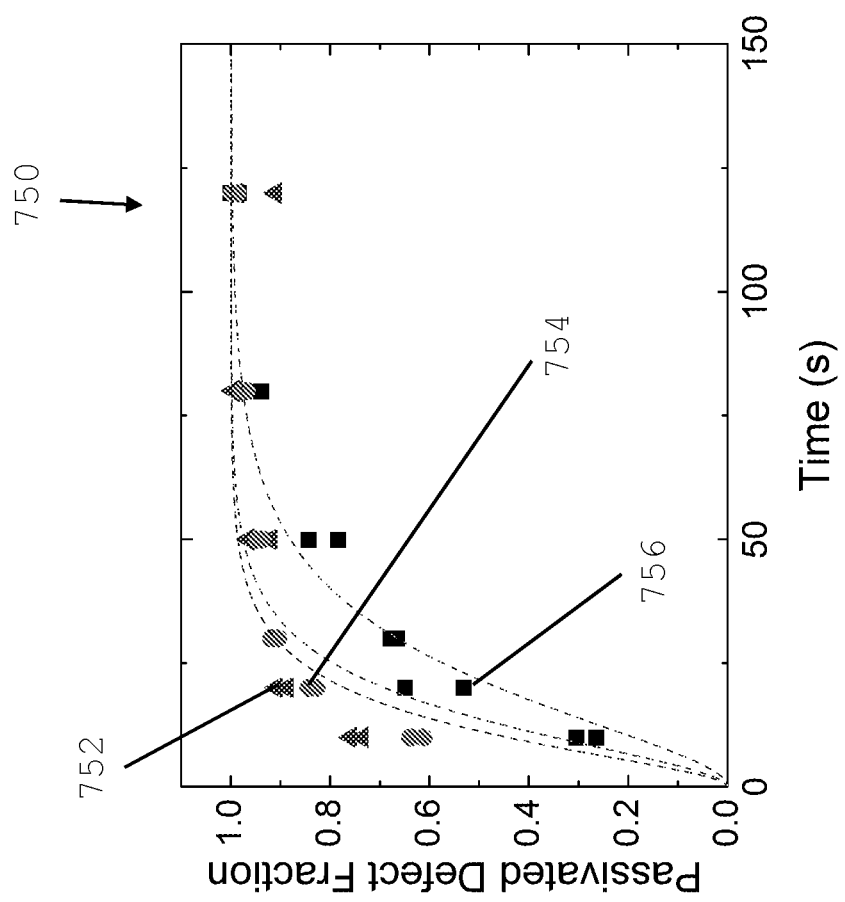

Referring now to FIG. 17, there is shown a plot with results for fired wafers where annealing is commenced with defects in an inactive state. The process seems to have been accelerated for samples with lower $J_0$ values. The triangles (752) show data for $J_0$=45±6 fA/cm²; the circles (754) show data for $J_0$=110±7 fA/cm² and the squares (556) show data for $J_0$=345±25 fA/cm². The dashed lines are data simulated using the calculated hole concentrations and the activation energy and pre-factor determined from the results in FIG. 15, along with values for defect passivation and de-stabilization from the literature.

The term "comprising" (and its grammatical variations) as used herein are used in the inclusive sense of "having" or "including" and not in the sense of "consisting only of".

In the disclosure the expression 'full defect formation' means formation of the large majority of the electrically active defects in the material. A small amount of defects may be still formed in the material after full defect formation by allowing longer exposure times. However, this small amount is such not to significantly affect the minority carrier lifetime in the silicon material or, for example, the performance of a photovoltaic device realised using the silicon material.

In the disclosure the expression 'effective doping concentration' means the net doping concentration. In p-type silicon doped solely with boron, this is simply the concentration of substitutional acceptor (boron) atoms (Na) in the silicon. In p-type silicon co-doped with p-type and n-type dopants, the net doping is the difference between Na and the concentration of n-type donor atoms (Nd).

The methods described herein can be advantageously applied to both large silicon areas and localised areas targeting particular structures within silicon devices.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The claims as defined in the invention are as follows:

1. A method for accelerating the formation of defects in doped silicon, the method comprising the steps of:
    exposing a portion of the doped silicon to electromagnetic radiation in a manner such that photons with an energy higher than that of a bandgap of the silicon provide a radiation intensity of at least 3 suns; and
    wherein one or more parameters of the radiation source are selected in a manner such that a minimum excess majority carrier concentration higher than 10% of an effective doping concentration of the exposed portion is maintained in the exposed portion during exposure to the electromagnetic radiation; and
    wherein the method further comprises the step of controlling a temperature of the silicon by varying the one or more parameters of the radiation during exposure in a manner such that electrically active defects are formed in at least a portion of the doped silicon and electrically active defects in the portion are passivated.

2. The method of claim 1 wherein the radiation is such that photons with energy higher than a bandgap of the silicon provide a radiation intensity of at least 10 suns.

3. The method of claim 1 wherein a minimum excess majority carrier concentration higher than 10% of an effective doping concentration of the doped silicon is maintained in the doped silicon for at least 90% of the exposure duration at radiation intensity of at least 3 suns.

4. The method of claim 1 wherein the minimum excess majority carrier concentration is at least twofold the effective doping concentration of the silicon.

5. The method of claim 1 wherein a passivation rate of the electrically active defects is higher than a formation rate of the electrically active defects.

6. The method of claim 5 wherein the steps of exposing a portion of the silicon to radiation and controlling a temperature of the silicon are performed in a manner such that the exposed portion reaches a stabilised condition in a predetermined period of time and, in the stabilised condition, further exposure of the exposed portion to radiation is capable of increasing the concentration of electrically active defects not more than a further 10%.

7. The method of claim 5 wherein the predetermined period of time is shorter than 20 seconds.

8. The method of any one of claim 5 wherein the method further comprises the step of cooling the silicon to a cooled temperature such to minimise reactivation of passivated defects.

9. The method of claim 5 further comprising the step of pre-heating the silicon to a process initial temperature, wherein the process initial temperature is selected based on one or more properties of the radiation used during the exposure step.

10. The method of claim 9 wherein the initial temperature is at least 150° C.

11. The method of claim 5 wherein the radiation has a pulsed waveform and the one or more parameters of the radiation varied during exposure comprise one or a combination of: frequency, duty cycle and amplitude of radiation pulse and the frequency is selected in manner such that the minimum excess majority carrier concentration is maintained throughout the duration of the pulse.

12. The method of claim 5 wherein the method further comprises the step of providing hydrogen atoms in the semiconductor material.

13. The method of claim 12 wherein the method further comprises the step of varying at least one parameter of the radiation during exposure to control the amount of hydrogen atoms in a given charge state.

14. The method of claim 1 wherein the doped silicon is part of silicon solar cell.

15. The method of any one of claim 6 wherein the electrically active defects comprise boron-oxygen defect.

16. A method for stabilising the performance of a photovoltaic cell comprising silicon material, the method comprising the steps of:
exposing a portion of the silicon material to electromagnetic radiation such that the portion of the silicon material reaches a temperature between 250° C. and 400° C. while exposed; the electromagnetic radiation being such that photons with energy higher than a bandgap of the silicon provide a radiation intensity of at least 10 suns; and
decreasing a power of the electromagnetic radiation during exposure in a manner such that the radiation intensity provided by photons with an energy higher than the bandgap of the silicon decreases and the temperature of the silicon material drops to a value below 150° C. in a predetermined period of time;
wherein a minimum excess majority carrier concentration higher than 10% of an effective doping concentration of the doped silicon is maintained in the doped silicon during the exposure of the doped silicon to the electromagnetic radiation.

17. The method of claim 16 wherein the steps of exposing a portion of the silicon to radiation and decreasing the power of the radiation during exposure are performed in a manner such that after the steps are performed the maximum loss of efficiency of the photovoltaic cell due to light induced degradation is 0.1% absolute.

18. A method of manufacturing a crystalline silicon homo-junction silicon solar cell, the method comprising the steps of:
providing a doped silicon substrate;
forming a p-n junction with the silicon substrate by introducing dopants having a polarity that is opposite to that of the silicon substrate; and
treating at least a portion of the silicon using the method in accordance with claim 1.

19. A silicon solar cell manufactured in accordance with the method of claim 18.

20. The method of claim 1 wherein the method is selectively applied to a localised portion of a silicon device to improve the performance of a structure disposed at the localised portion.

21. A method for accelerating the formation of defects in doped silicon, the method comprising the steps of:
exposing a portion of the doped silicon to electromagnetic radiation in a manner such that photons with an energy higher than that of a bandgap of the silicon provide a radiation intensity of at least 3 suns; and
wherein one or more parameters of the radiation source are selected in a manner such that a minimum excess majority carrier concentration higher than 10% of an effective doping concentration of the exposed portion is maintained in the exposed portion during exposure to the electromagnetic radiation; and
wherein the method further comprises the step of controlling a temperature of the silicon by varying the one or more parameters of the radiation during exposure; in a manner such that electrically active defects are formed in at least a portion of the doped silicon and electrically active defects in the portion are passivated and wherein a passivation rate of the electrically active defects is higher than a formation rate of the electrically active defects.

* * * * *